United States Patent
Tanji et al.

(10) Patent No.: US 6,307,906 B1
(45) Date of Patent: Oct. 23, 2001

(54) CLOCK AND DATA RECOVERY SCHEME FOR MULTI-CHANNEL DATA COMMUNICATIONS RECEIVERS

(75) Inventors: Todd M. Tanji, Egan; James R. Welch, Maplegrove, both of MN (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/168,028

(22) Filed: Oct. 7, 1998

Related U.S. Application Data

(60) Provisional application No. 60/061,319, filed on Oct. 7, 1997.

(51) Int. Cl.[7] .................................................. H03D 11/06
(52) U.S. Cl. ........................................... 375/376; 375/375
(58) Field of Search ...................................... 375/354, 376, 375/326, 327, 375; 327/148; 359/119, 158, 189, 180, 183, 187

(56) References Cited

U.S. PATENT DOCUMENTS

| | | | |
|---|---|---|---|
| 5,537,448 | * 7/1996 | Schwarz et al. | 375/376 |
| 6,009,134 | * 12/1999 | Yoon | 375/376 |
| 6,041,090 | * 3/2000 | Chen | 375/376 |
| 6,211,739 | * 4/2001 | Synder et al. | 331/1 A |

\* cited by examiner

Primary Examiner—Chi Pham
Assistant Examiner—Dung X. Nguyen
(74) Attorney, Agent, or Firm—Gary Care Ware Freidenrich

(57) ABSTRACT

The multiple-channel clock and data recovery scheme of the present invention derives a single clock signal from multiple mis-matched data streams. The single clock is phased to provide a clocking signal such that the data sampler of the clock and data recovery scheme performs bit center sampling of the data at the bit center average of all channels. The phase of the recovery clock is the average of all the data stream phases, and is the optimal sampling phase for minimum combined bit error rate of all the channels.

22 Claims, 7 Drawing Sheets

Charge Pump Circuit

LOOP FILTER CIRCUIT

DELAY CELL

Voltage Controlled Oscillator

CLOCK AND DATA RECOVERY SCHEME FOR MULTI-CHANNEL DATA COMMUNICATIONS RECEIVERS

CROSS-REFERENCE TO RELATED APPLICATION

This application claims priority under 35 USC § 119 to U.S. Pat. application Ser. No. 60/061,319, filed Oct. 7, 1997, which is incorporated herein by reference.

BACKGROUND OF THE INVENTION

1. Field of the Invention

The invention relates to fiber optic communication, and more particularly, to a multiple-channel clock and data recovery scheme for re-timing fiber optic data input streams into a synchronous state.

2. Description of Related Art

With the advent of parallel ribbon fiber cable and optical component array integration, high-speed optical data communication links are becoming increasingly practical and desirable. It is a challenge in achieving low-cost parallel modules for formatting fiber optic data, however, to incorporate a data receiver that performs clock and data recovery on multiple data input channels simultaneously. A typical data communications receiver for a single-channel input system requires a clock recovery circuit to extract timing information from an incoming data bit stream.

The recovery clock provides synchronous sampling off of the input data bits.

Carrying this approach to a multi-channel input system, however, induces error into the system. The application of the typical single-channel approach to a multi-channel input system typically requires integrating multiple clocks, e.g. one clock per channel. However, integrating one clock per channel results in multiple clocks that are competing on a single integrated circuit. The multiple clocks each tend to accumulate jitter due to the cross-coupling of the associated relatively high-power signals.

A need exists, therefore, for a multiple-channel clock and data recovery scheme that is capable of outputting a single clock signal to re-time all of the multiple channel data and that is thereby able to reduce the jitter and channel crosstalk that can occur with multiple clocks.

SUMMARY OF THE INVENTION

The problems outlined above are in large measure solved by a multiple-channel clock and data recovery scheme according to the present invention. The multiple-channel clock and data recovery scheme is a data synchronization system for a fiber optics data communication receiver. The fiber optics data communication receiver has a plurality of fiber optic data inputs. Each data input is received by a data sampler. The data sampler samples the input data according to a transition in a clocking signal received from a single clock. Each data sampler produces a data output for each fiber optic data input sampled. A phase detector is provided for each data input channel and compares this data output with the single clock signal. The phase detector determines a phase difference between the data output and the clock signal for each data input channel. The single clock averages the phase differences for all of the data input channels and determines an average data center for all of the data input channels. The single clock then produces the clocking signal, which is directed to the data sampler and phase detector, such that the data sampler samples the input data at the average data center.

DETAILED DESCRIPTION OF PREFERRED EMBODIMENTS

Figure 1:
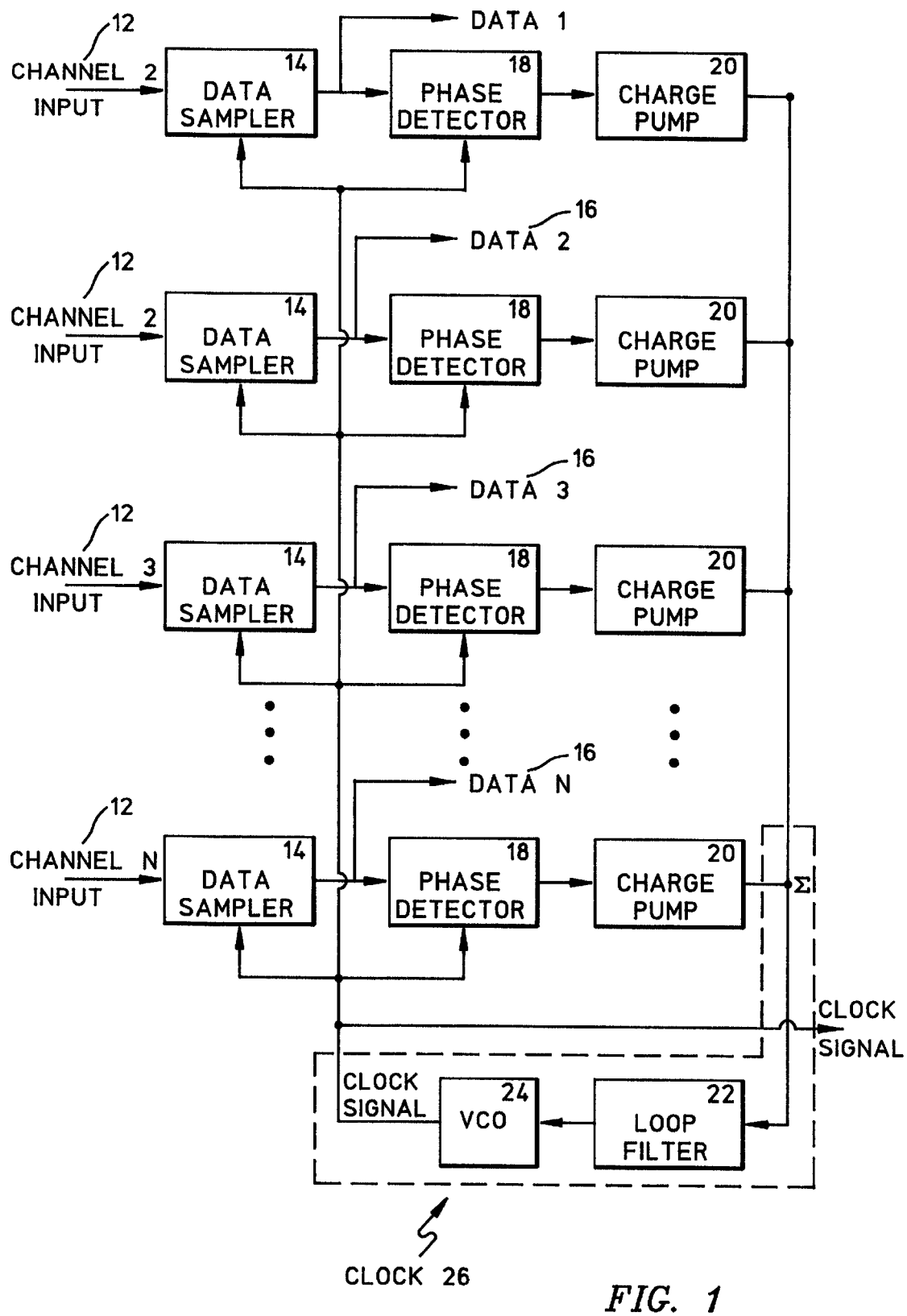
FIG. 1 is a block diagram of a multiple-channel clock and data recovery scheme according to an embodiment of the present invention.

FIG. 1 is a block diagram reflecting a multiple-channel clock and data recovery scheme 10 according to an embodiment of the invention. Scheme 10 generally incorporates N input channels 12, each input channel 12 being directed into an associated data sampler 14 whose output is directed to an associated data output 16 and into an associated phase detector 18. The output of each phase detector 18 is coupled to an associated charge pump 20. In this embodiment, there are N data samplers 14, N phase detectors 18 and N charge pumps 20. The outputs of each of the charge pumps 20 are directed to a single loop filter 22 whose output is input to a voltage controlled oscillator (VCO) 24. The output of VCO 24 is input to each data sampler 14 and each phase detector 18. Clock 26 generally comprises the components of VCO 24 and loop filter 22.

Figure 2:
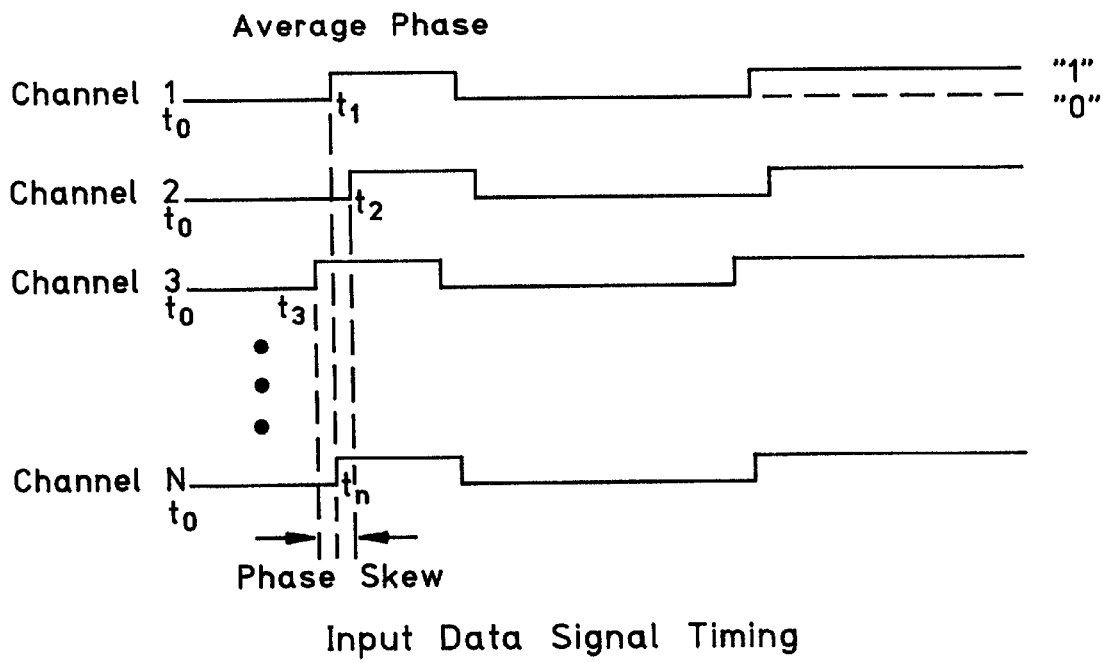
FIG. 2 is an input data signal timing diagram depicting 1 through N channels of binary encoded input data.

FIG. 2 provides an example of N input signals that are fed into N input channels 12. As shown, the N input signals are binary encoded signals having two distinct electrical levels representing logic "1" and "0". Each input binary encoded signal, channel 1, 2, 3, . . . N, steps to logical level "1" at time $t_1, t_2, t^3, \ldots t_N$, respectively, as measured from time $t_0$. Due to transmission path mismatch, the data channels are not necessarily perfectly aligned in time, i.e. $t_1$ does not necessarily equal $t_2$ which does not necessarily equal $t_3$. The phase, or time, difference between the fastest and slowest channels is defined as the phase skew. The average phase of all N channels is defined as the sum of all the phase transition times divided by N, the number of channels. In other words, $$\text{average phase} = [t_1 + t_2 + t_3 + \ldots + t_N]/N. \tag{1}$$

Figure 3:
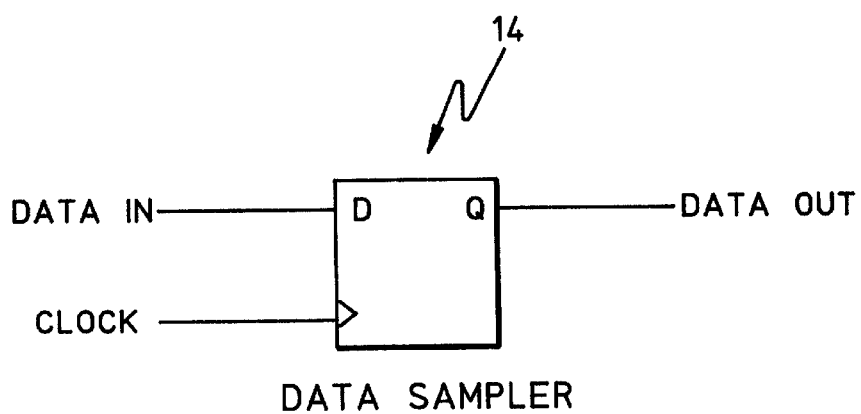
FIG. 3 depicts an embodiment of a data sampler utilized in the present invention.

Data sampler 14, depicted in detail in FIG. 3, is preferably implemented with a d-type flip-flop. Each of the N data samplers 14 receives and re-times its data input signal from N-input channel 12 according to the clock signal received from clock 26.

As such, DATA IN is preferably sampled at the "0" to "1" transition of the clock signal from clock 26 and presented at DATA OUT. Note that the d-type flip-flop operates such that the next state of the flip-flop is equal to its present excitation. For example, if a one is applied to DATA IN, at the next transition of CLOCK signal, Q (DATA OUT) will be a logic level one. This operation of data sampler 14 synchronizes the data with clock 26.

Figure 4A:
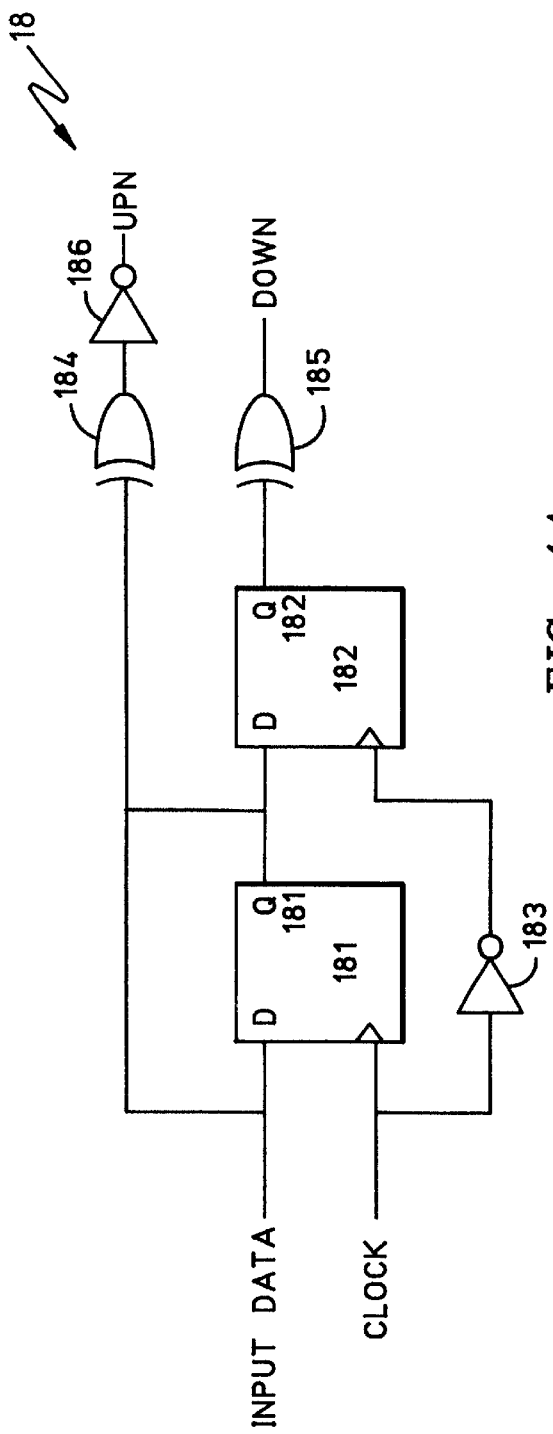
FIG. 4A depicts an embodiment of a phase detector utilized in the present invention.

The data out of each data sampler 14 is received by a phase detectors 18, depicted in detail in FIG. 4A. Phase detector 18 preferably comprises a first d-type flip-flop 181 and a second d-type flip-flop 182. As shown, data output from data sampler 14 is input to flip-flop 181. The clock signal from clock 26 is input to flip-flop 181 and is also sent through NOT gate 183 and input to flip-flop 182. The output of flip-flop 181, designated $Q_{181}$, is input to exclusive OR gate 184 with the data input signal from data sampler 181 and is also input to exclusive OR gate 185 with the output, designated $Q_{182}$, of flip-flop 182. The output of exclusive OR gate 184 is input to a NOT gate 186 whose output is designated UPN. The output of exclusive OR gate 185 is designated DOWN. Outputs UPN and DOWN drive the input to charge pump 20.

Figure 4B:
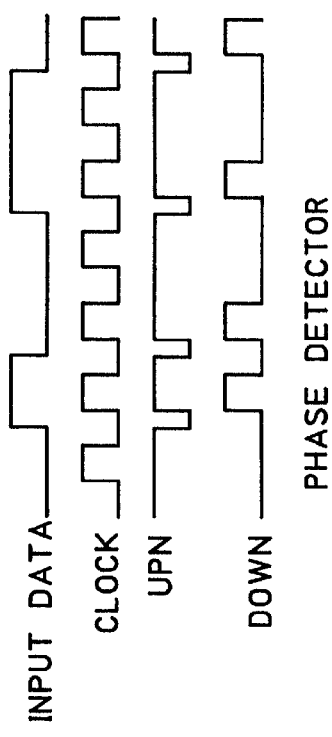
FIG. 4B depicts the input waveforms DATA and CLOCK to the phase detector of FIG. 4A and depicts the output waveforms UPN and DOWN from the phase detector of FIG. 4A.

FIG. 4B provides example waveforms to help explain the operation of phase detector 18. Phase detector 18 compares the phase transitions of the INPUT DATA from data sampler 14, which is non-return-to-zero (NRZ) data, with the reference CLOCK signal from clock 26. The rising edge of INPUT DATA causes the UPN output to transition active, i.e. "0", and is reset to non-active, i.e. "1", on a rising edge of CLOCK. The rising edge of CLOCK causes DOWN to transition active, i.e. "1", for one half of a CLOCK cycle. The difference in the active pulse widths of UPN and DOWN represents the phase difference between INPUT DATA and CLOCK (Note that when clock and data recovery scheme 10 is in steady state, the pulse widths are equal to one half of a clock cycle). As such, each phase detector 18 operates to determine the phase error of its N input channel 12 and generates phase error voltage pulses.

Figures 5A, 5B:
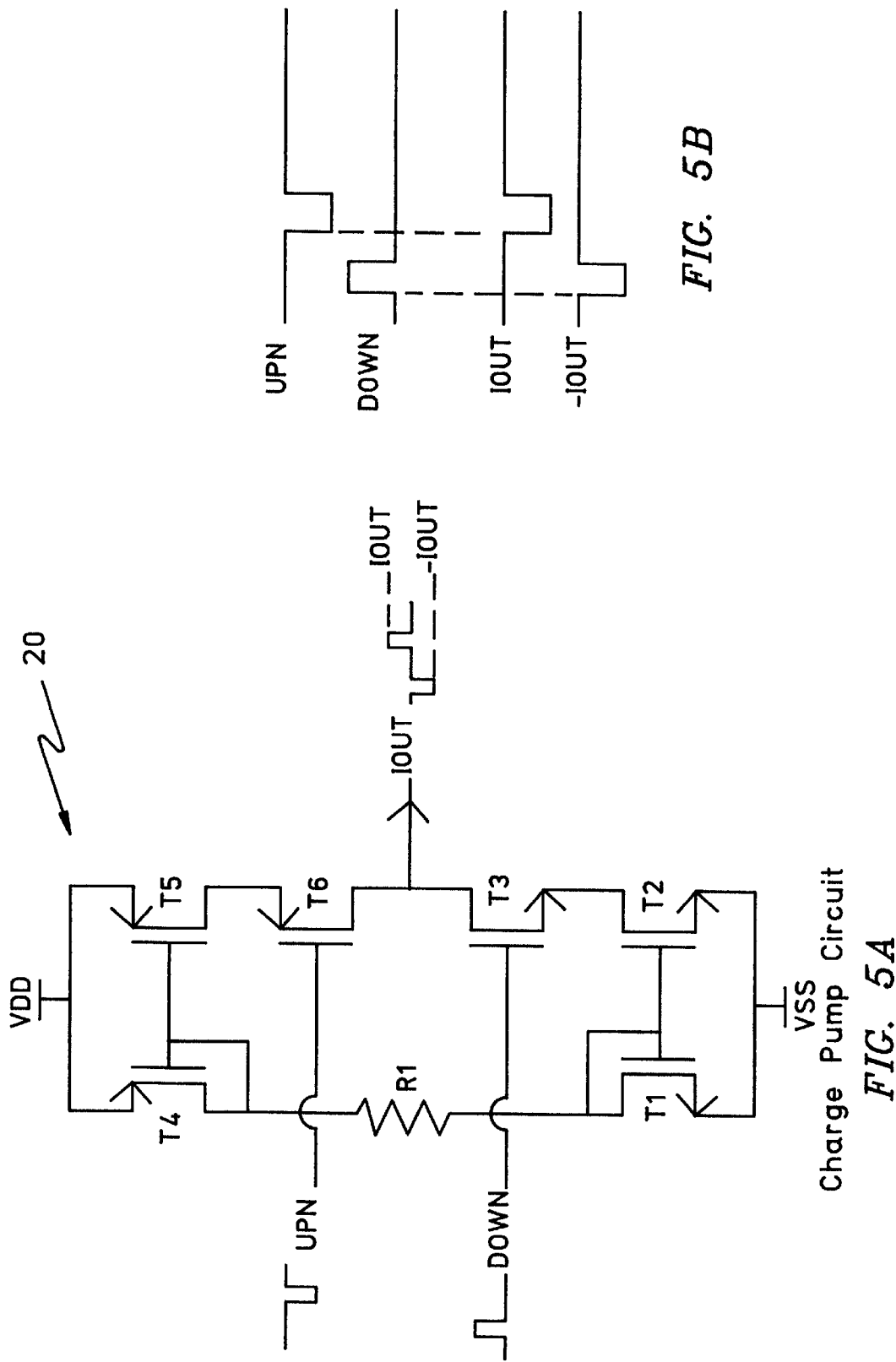
FIG. 5A depicts an embodiment of a charge pump circuit utilized in the present invention.
FIG. 5B depicts the input and output waveforms of the charge pump circuit of FIG. 5A.

Charge pump 20, depicted in detail in FIG. 5A, receives signals UPN and DOWN from phase detector 18. Signal UPN is tied to the gate of transistor T6 while the source of T6 is tied to the drain of transistor T5 and the drain of T6 is tied to the drain of T3 and provides the output signal IOUT. The source of T5 is connected to the source of transistor T4 and to voltage $V_{DD}$. The gate of T5 is connected to the gate of T4 and to the drain of T4. The drain of T4 is also connected resistor R1. The value of R1 is determined by specific system and circuit parameters. As an example, for N=4, a data rate of 1.25 Gbit per channel and a typical commercially available integrated circuit process, a typical value for R1 would be 130 kohms. This would result in 10 microampere output current pulses. R1 is further connected to the drain and gate of transistor T1 while the source of T1 is connected to the source of T2 and voltage $V_{SS}$. The gates of T1 and T2 are tied together as are the source of transistor T3 and the drain of T2. The gate of T3 is connected to the input DOWN from phase detector 18.

As indicated by the output waveforms IOUT and –IOUT, shown in FIG. 5B, charge pump 20 generates positive and negative current pulses when triggered by digital pulses at inputs UPN and DOWN, respectively. Bias resistor R1 feeds current into NMOS transistor T1. This current is mirrored by T2 and is switched, as a negative current, to the output IOUT, by switch T3, which is controlled by the input DOWN. In a similar manner, R1 feeds an identical current into PMOS transistor T4. This current is mirrored by T5 and is switched, as a positive current, to the output IOUT, through switch T6. T6 is controlled by input UPN. In this manner, charge pump 20 converts the phase error voltage pulses from phase detector 18 to current pulses. These current pulses are preferably hard-wired together and, as such, are mathematically summed and input to single loop filter 22.

Figure 6:
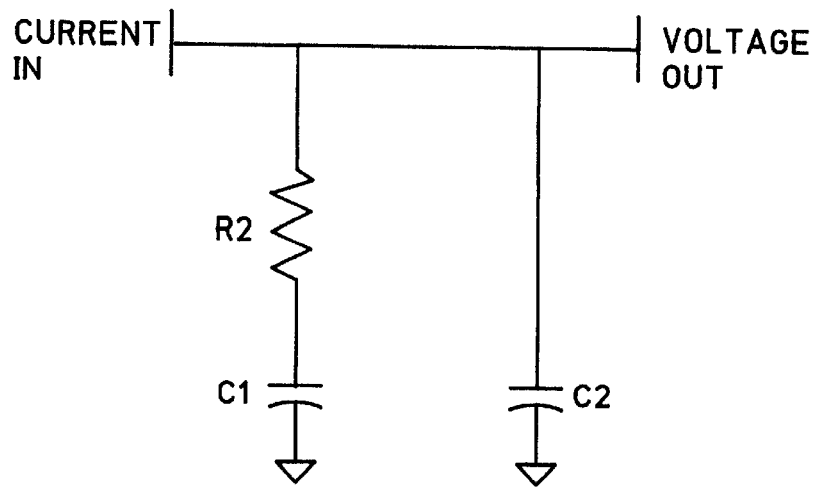
FIG. 6 depicts an embodiment of a loop filter utilized in the present invention.

Loop filter 22 is depicted in detail in FIG. 6. The mathematically summed current input from charge pumps 20, indicated CURRENT IN, are tied to the series sequence of resistor R2 and capacitor C1 and to capacitor C2, all of which operate to convert the CURRENT IN to a low frequency, control voltage, VOLTAGE OUT, for VCO 24. As such, a closed clock and data recovery feedback loop results. The values of R2, C1 and C2 are determined by specific system requirements and circuit parameters. As an example, for N equal to 4, a data rate of 1.25 Gbit per channel, typical values would be R2 equal to 100 ohms, C1 equal to 1 nanoFarad, and C2=10 picofarads. It should be noted, these values are only illustrative of one embodiment and are not meant to be limiting.

Figure 7C:
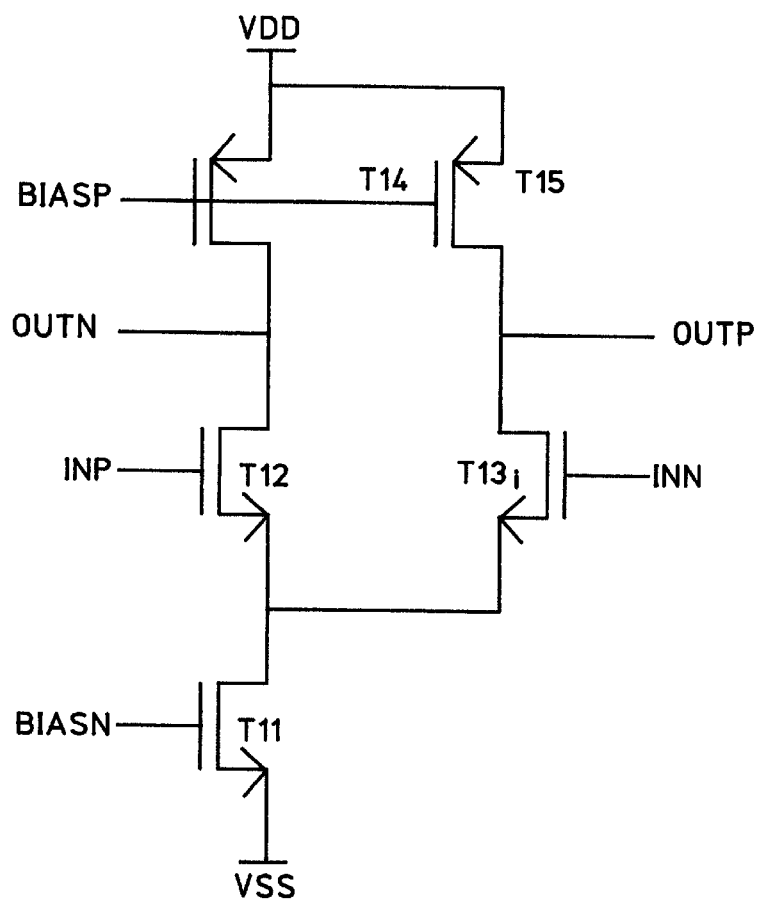
FIG. 7C depicts a circuit diagram of the delay cell of FIG. 7A.
Figures 7A, 7B:
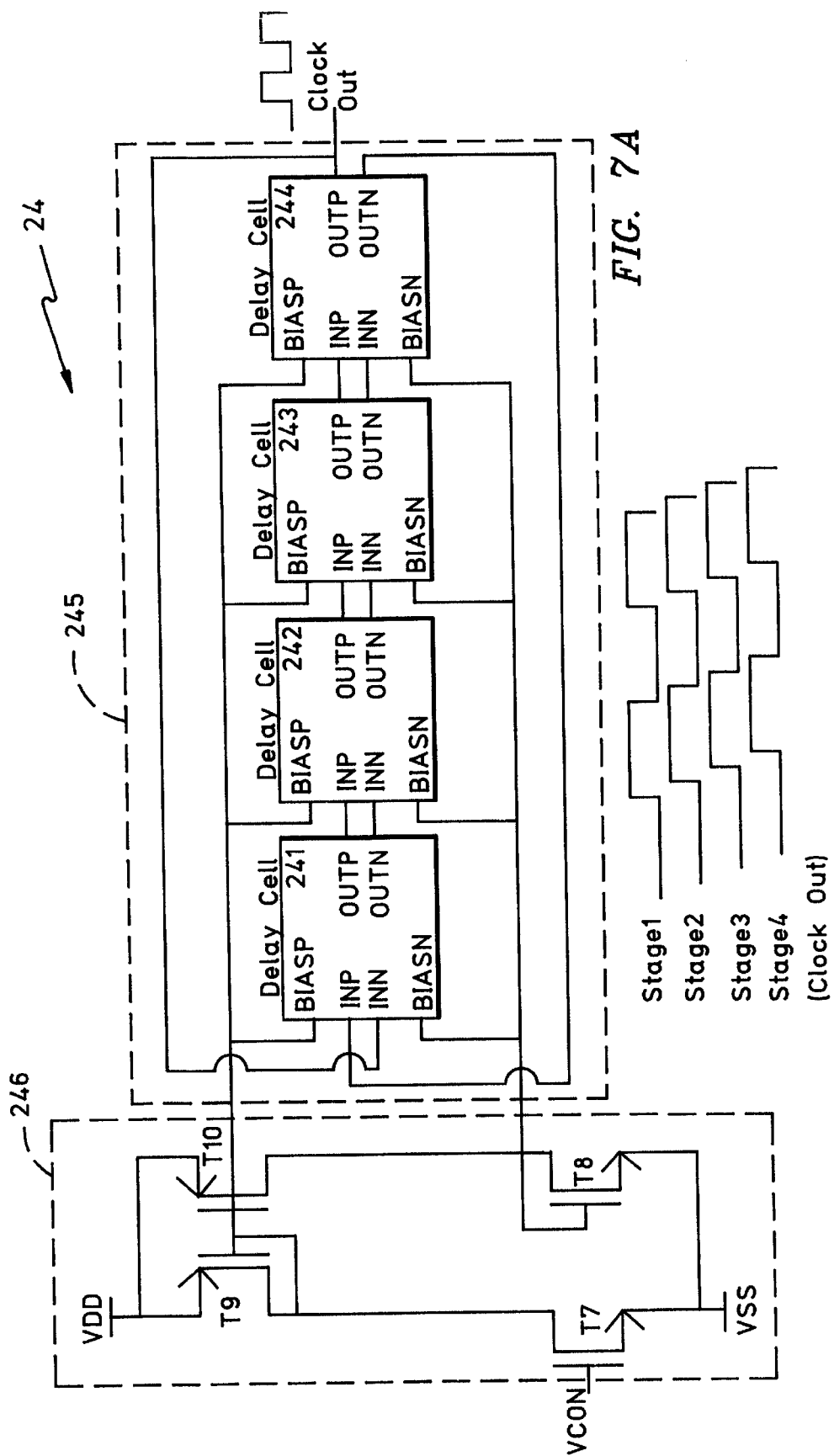
FIG. 7A depicts an embodiment of a voltage controlled oscillator utilized in the present invention. The voltage controlled oscillator includes a voltage control circuit and a plurality of delay cells.
FIG. 7B depicts the output waveforms of each of the delay cells of FIG. 7A.

VCO 24, depicted in detail in FIG. 7A, preferably comprises four delay cells, 241, 242, 243 and 244 connected as a ring oscillator 245, and a voltage control circuit 246. The voltage from loop filter 22, VOLTAGE OUT, is input to voltage control circuit 243 as VCON. VCON is tied to the gate of transistor T7 whose source is tied to voltage $V_{SS}$ and to the source of T8. The drain of T7 is connected to the drain and gate of T9. The source of T9 is connected to voltage $V_{DD}$ and to the source of transistor T10. The gate of T10 is tied to the gate of T9 and is provided as the input BIASP to each of the delay cells, 241, 242, 243, and 244. The drain of T10 is connected to the drain of T8, to the gate of T8 and provides the input BIASN to each of the delay cells, 241, 242, 243 and 244. The output OUTP of delay cell 241 is tied to the input INP of delay cell 242. The output OUTN of delay cell 241 is tied to the input INN of delay cell 242. Likewise, the output OUTP of delay cell 242 is input to input INP of delay cell 243 and the output OUTP of delay cell 243 is input to the input INP of delay cell 244. The output OUTN of delay cell 242 is input to the input INN of delay cell 243 and the output OUTN of delay cell 243 is input to the input INN of delay cell 244. The output OUTP of delay cell 244 provides the output clock signal, CLOCK OUT, and is tied back to the input INN of delay cell 241. The output OUTN of delay cell 244 is tied back to the input INP of delay cell 241.

Due to the time delay of each cell, 241, 242, 243 and 244, and the overall positive feedback of the loop, the circuit depicted in FIG. 7A will oscillate resulting in a digital square wave output, CLOCK OUT. Each delay cell output switches sequentially based on the cell delay. Voltage control of VCO 24 is achieved by modulating the bias current of the delay cell, 241, 242, 243 and 244. T7 acts as a voltage to current converter and feeds current into T9, which generates a bias voltage BIASP for PMOS transistors in delay cells, 241, 242, 243 and 244. The current control is also mirrored into T8 via T10 to generate the bias voltage BIASN for NMOS transistors in delay cells 241, 242, 243 and 244.

FIG. 7B provides a view of how the output of VCO 24 is delayed by each of the delay cells: delay cell 241 at stage 1, delay cell 242 at stage 2, delay cell 243 at stage 3 and delay cell 244, the output clock signal CLOCK OUT, at stage 4.

A schematic of a delay cell, i.e. delay cell 241, 242, 243 and 244, is depicted in FIG. 7C. Voltage BIASN is connected to the gate of transistor T11 while the source of T11 is connected to voltage $V_{ss}$. The drain of T11 is connected to the source of both transistor T12 and T13. The gate of T12 is tied to input INP and the gate of T13 is tied to the input INN. The drain of T12 is connected to the drain of T14 and provides the signal OUTN. The drain of T13 is connected to the drain of T15 and provides the signal OUTP. The gates of transistors T14 and T15 are tied to voltage BIASP while the sources of T14 and T15 are tied to voltage $V_{DD}$.

As shown in FIG. 7C, the delay cell preferably comprises an NMOS differential pair, T12 and T13, which steer bias current from T11 into PMOS loads, T14 and T15. T14 and T15 are biased in the linear transistor region of operation and hence, appear as linear resistive loads. As the bias current through T11 increases, more current is provided at the outputs to drive the circuit capacitance higher resulting in a higher slew rate. Simultaneously, the voltage at BIASP is decreased causing the effective resistance of T14 and T15 to decrease. The decrease in load resistance is compensated by an increase in drive current resulting in a stable output signal amplitude with changing cell delay.

Figure 8:
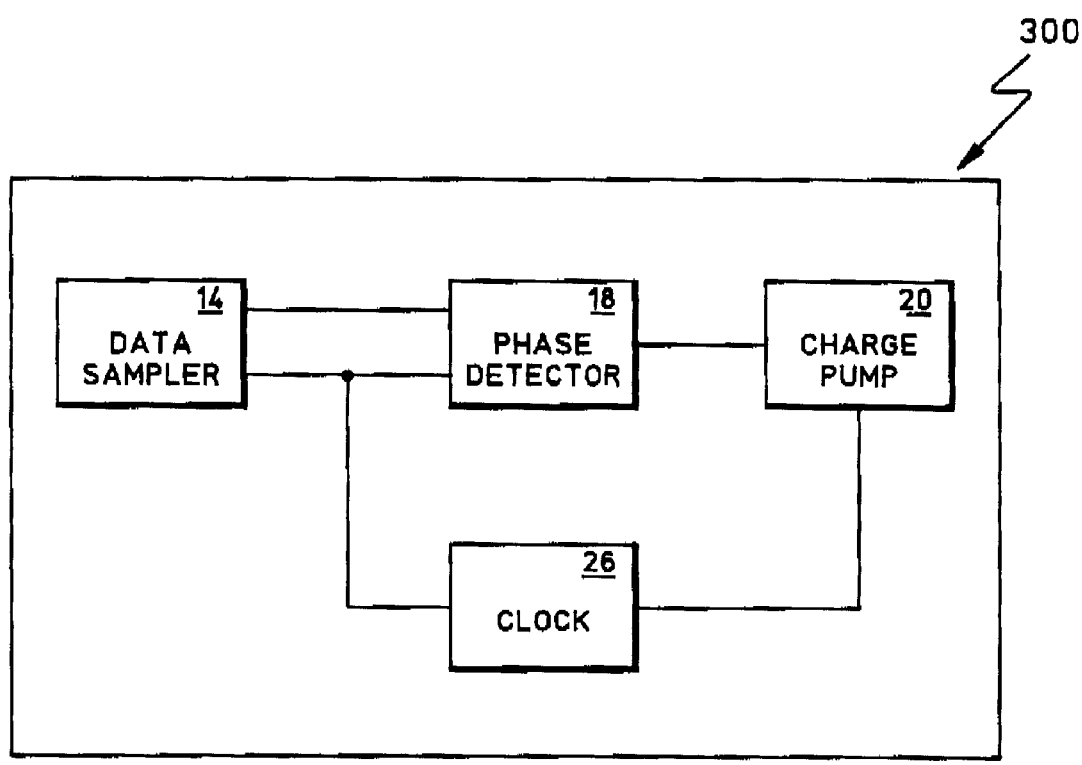
FIG. 8 is a schematic illustration of a single integrated circuit containing the clock and data recovery scheme according to the present invention.

The result of clock and data recovery scheme 10 is a recovery clock 26 that averages the phase transition times of all data channels and that samples the data at the average data bit center of all channels 12, which is the optimal sampling phase for minimum combined bit error rate of all the channels. Other advantages provided by scheme 10 include reducing overall power consumption, since only a single VCO 24 is used for all input channels 12, and reducing overall integrated circuit chip area since a single loop filter may be used for all input channels 12. Furthermore, the jitter that would usually result from multiple competing high-power clock crosstalk on a single integrated circuit is substantially eliminated. Clock and data recovery scheme 10 is preferably contained as part of single integrated circuit that may or may not contain additional circuitry. An example of a single integrated circuit 300 containing clock and data recovery scheme 10 is illustrated schematically in FIG. 8. It should be noted that the integrated circuit 300 may include one or more of the circuits embodying the present invention. In addition, integrated circuit 300 may also include other integrated circuitry not shown. Note that while a single integrated circuit is preferred, other appropriate manners of establishing clock and data recovery scheme, e.g. individual components, may be used without departing from the spirit or scope of the invention.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed:

1. A data synchronization system for a fiber optics data communications receiver, the system comprising:
    a plurality of input channels;
    a plurality of data samplers having at least first and second inputs and an output, wherein each of the first data sampler inputs is connected to an associated input channel;
    a plurality of phase detectors having at least first and second inputs and an output, wherein each of the first phase detector inputs is connected to an associated data sampler output; and
    a single clock having an input and an output, wherein the clock input is connected to the output of the plurality of phase detectors and the clock output is connected to the second inputs of the plurality of phase detectors and to the second inputs of the plurality of data samplers.

2. The system of claim 1, wherein said single clock comprises a voltage-controlled oscillator and a loop filter operably connected to said voltage-controlled oscillator.

3. The system of claim 1, further comprising a plurality of charge pumps operably connected between the plurality of phase detectors and the single clock.

4. The system of claim 1, wherein said phase detector generates a voltage pulse representative of said phase difference.

5. The system of claim 4, further comprising a charge pump, wherein said charge pump converts said voltage pulse of said phase detector to a current pulse.

6. The system of claim 2, further comprising a charge pump, wherein said phase detector generates a voltage pulse representative of said phase difference, and wherein said charge pump converts said voltage pulse of said phase detector to a current pulse for input to said loop filter.

7. A data synchronization system for a fiber optics data communications receiver, said system comprising:
    a plurality of fiber optic data inputs;
    a data sampler, wherein said data sampler samples the data from each of said plurality of fiber optic data inputs according to a clock signal from a single clock and produces a data output for each of said plurality of fiber optic data inputs from the sampled data; and
    a phase detector, wherein said phase detector compares said data output for each of said plurality of fiber optic data inputs with said clock signal to determine a phase difference between said data output and said clock signal for each of said plurality of fiber optic data inputs;
    wherein said single clock averages said phase difference for all of said plurality of fiber optic data inputs to determine an average data center of all of said plurality of fiber optic data inputs and produces said clock signal such that said data sampler samples the data from each of said plurality of fiber optic data inputs at said average data center.

8. The system of claim 7, wherein said single clock comprises a voltage-controlled oscillator and a loop filter operably connected to said voltage-controlled oscillator.

9. The system of claim 7, further comprising a charge pump operably connected between the phase detector and the clock.

10. The system of claim 7, wherein said phase detector generates a voltage pulse representative of said phase difference.

11. The system of claim 10, further comprising a charge pump, wherein said charge pump converts said voltage pulse of said phase detector to a current pulse.

12. The system of claim 8, further comprising a charge pump, wherein said phase detector generates a voltage pulse representative of said phase difference, and wherein said charge pump converts said voltage pulse of said phase detector to a current pulse for input to said loop filter.

13. A data synchronization system for a fiber optics data communications receiver, wherein said fiber optics data communications receiver has a plurality of fiber optic data inputs, said system comprising:
    data sampling means for sampling data from each of said plurality of fiber optic data inputs according to a clock signal from a single clocking means and for producing a data output for each of said plurality of fiber optic data inputs from the sampled data; and phase detecting means for comparing said data output for each of said plurality of fiber optic data inputs with said clock signal and for determining, from the comparison, a phase difference between said data output and said clock signal for each of said plurality of fiber optic data inputs;

wherein said single clocking means is for averaging said phase difference of all of said plurality of fiber optic data input, for determining, from said averaging, an average data center of all of said plurality of fiber optic data inputs, and for producing said clock signal such that said data sampling means samples the data from each of said plurality of fiber optic data inputs at said average data center.

14. The system of claim 13, wherein said single clocking means comprises a voltage-controlled oscillator and a loop filter operably connected to said voltage-controlled oscillator.

15. The system of claim 13, further comprising charge pumping means for converting a pulse of said phase detecting means to a current pulse for input to said loop filter.

16. The system of claim 13, wherein said phase detecting means generates a voltage pulse representative of said phase difference.

17. The system of claim 16, further comprising charge pumping means for converting said voltage pulse of said phase detecting means to a current pulse.

18. The system of claim 14, further comprising charge pumping means, wherein said phase detecting means generates a voltage pulse representative of said phase difference, and wherein said charge pumping means is for converting said voltage pulse of said phase detecting means to a current pulse for input to said loop filter.

19. A method of synchronizing a plurality of fiber optic data inputs, said method comprising the steps of:

sampling data from each of a plurality of fiber optic data inputs according to a single clock signal;

producing a data output for each of said plurality of fiber optic data inputs from the sampled data;

comparing said data output for each of said plurality of fiber optic data inputs with said single clock signal;

determining a phase difference between said data output and said single clock signal for each of said plurality of fiber optic data inputs;

averaging said phase difference of all of said plurality of fiber optic data inputs;

determining an average data center of all of said plurality of fiber optic data inputs; and producing said single clock signal such that the step of sampling is performed at said average data center.

20. The method of claim 19, further comprising the step of producing a voltage pulse representative of said phase difference.

21. The method of claim 20, further comprising the step of converting said voltage pulse to a current pulse representative of said phase difference.

22. The method of claim 19, further comprising the step of mathematically summing the determined phase differences from each of said plurality of fiber optic data inputs.

* * * * *